(12) United States Patent
Foucal et al.

(10) Patent No.: US 10,337,913 B2
(45) Date of Patent: Jul. 2, 2019

(54) OPTOELECTRONIC MODULE FOR A CONTACTLESS FREE-SPACE OPTICAL LINK, ASSOCIATED MULTICHANNEL MODULES, ASSOCIATED INTERCONNECTION SYSTEM, METHOD OF PRODUCTION AND CONNECTION TO A BOARD

(71) Applicant: RADIALL, Aubervilliers (FR)

(72) Inventors: Vincent Foucal, Lyons (FR); Christian Claudepierre, Saint-Priest (FR); Mathias Pez, Paris (FR); Laurence Pujol, Crolles (FR); François Quentel, Ville sous Anjou (FR)

(73) Assignee: RADIALL, Aubervilliers (FR)

( * ) Notice: Subject to any disclaimer, the term of this patent is extended or adjusted under 35 U.S.C. 154(b) by 0 days.

(21) Appl. No.: 15/171,940

(22) Filed: Jun. 2, 2016

(65) Prior Publication Data
US 2016/0356643 A1    Dec. 8, 2016

(30) Foreign Application Priority Data

Jun. 2, 2015  (FR) ..................................... 15 54994

(51) Int. Cl.
*G01J 1/04*     (2006.01)
*G02B 6/42*     (2006.01)
(Continued)

(52) U.S. Cl.
CPC .......... *G01J 1/0403* (2013.01); *G01J 1/0411* (2013.01); *G01J 1/44* (2013.01); *G02B 6/4206* (2013.01);
(Continued)

(58) Field of Classification Search
CPC ...... G02B 6/42; G02B 6/4204; G02B 6/4206; H05K 1/0266; H05K 1/0274
(Continued)

(56) References Cited

U.S. PATENT DOCUMENTS 4,727,457 A    2/1988  Thillays
5,266,794 A    11/1993 Olbright et al.
(Continued)

FOREIGN PATENT DOCUMENTS

EP    0585186 A2    3/1994
JP    S59-25284 A   2/1984
(Continued)

OTHER PUBLICATIONS

Jan. 4, 2016 Search Report issued in French Application No. 1554994.

*Primary Examiner* — Kevin K Pyo
(74) *Attorney, Agent, or Firm* — Oliff PLC

(57) ABSTRACT

An optoelectronic module, intended to provide a conversion of an electrical signal from an electronic board into an optical signal propagated in free space or vice versa, includes the following stack: an electronic board, intended to act as an interface with an electronic application board; an electronic control component suitable for controlling an optoelectronic component, the electronic component being attached directly onto the electronic board and electrically connected to the electronic circuit; an optoelectronic component suitable for transmitting or receiving a light signal via its upper surface, the optoelectronic component being attached directly on the top of the electronic control component and electrically connected to the electronic component; an optical device suitable for transmitting an optical signal; an optical device support, the support being attached, preferably by gluing or brazing, directly onto the electronic
(Continued)

Figure 1:
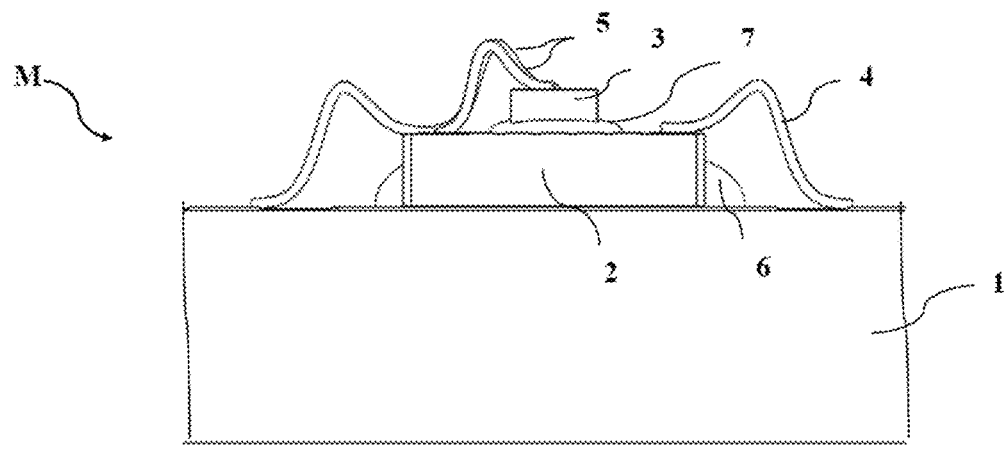

board so as to ensure the mechanical alignment between the optical device and the optoelectronic component.

18 Claims, 5 Drawing Sheets

(51) Int. Cl.
| | |
|---|---|
| *G02B 6/43* | (2006.01) |
| *G02B 7/02* | (2006.01) |
| *H01L 31/0203* | (2014.01) |
| *H01L 33/58* | (2010.01) |
| *H04B 10/80* | (2013.01) |
| *G01J 1/44* | (2006.01) |
| *H05K 1/02* | (2006.01) |
| *H05K 1/18* | (2006.01) |
| *H05K 3/30* | (2006.01) |
| *H05K 5/00* | (2006.01) |
| *H01L 31/0232* | (2014.01) |
| *H01L 33/48* | (2010.01) |
| *H01S 5/022* | (2006.01) |
| *H01L 31/105* | (2006.01) |
| *H01S 5/183* | (2006.01) |
| *H01L 25/075* | (2006.01) |

(52) U.S. Cl.
CPC ............ *G02B 6/43* (2013.01); *G02B 7/027* (2013.01); *H01L 31/0203* (2013.01); *H01L 31/02325* (2013.01); *H01L 33/58* (2013.01); *H04B 10/803* (2013.01); *H05K 1/0266* (2013.01); *H05K 1/0274* (2013.01); *H05K 1/181* (2013.01); *H05K 3/303* (2013.01); *H05K 5/0026* (2013.01); *G02B 6/4224* (2013.01); *H01L 25/0756* (2013.01); *H01L 31/105* (2013.01); *H01L 33/486* (2013.01); *H01L 2224/48091* (2013.01); *H01L 2224/48472* (2013.01); *H01L 2224/73265* (2013.01); *H01L 2924/19107* (2013.01); *H01S 5/02212* (2013.01); *H01S 5/02276* (2013.01); *H01S 5/02288* (2013.01); *H01S 5/183* (2013.01); *H05K 2201/10121* (2013.01); *H05K 2203/167* (2013.01)

(58) Field of Classification Search
USPC ........................... 250/208.1, 239; 385/27, 39
See application file for complete search history.

(56) References Cited

U.S. PATENT DOCUMENTS

| | | |
|---|---|---|
| 5,783,815 A | 7/1998 | Ikeda |
| 6,049,656 A * | 4/2000 | Kim ............... B23K 1/005 219/85.12 |
| 6,266,089 B1 * | 7/2001 | Shimamura ........ H04N 1/40056 250/208.1 |
| 6,301,035 B1 | 10/2001 | Schairer |
| 6,393,183 B1 | 5/2002 | Worley |
| 2004/0041222 A1 | 3/2004 | Loh |
| 2004/0080658 A1 | 4/2004 | Cambou et al. |
| 2004/0184737 A1 | 9/2004 | Oono et al. |
| 2005/0263841 A1 | 12/2005 | Fincato et al. |
| 2010/0247043 A1 | 9/2010 | Sugawara et al. |
| 2011/0058817 A1 | 3/2011 | Kuo et al. |
| 2012/0230701 A1 | 9/2012 | Murata et al. |
| 2014/0193160 A1 | 7/2014 | Yagisawa et al. |

FOREIGN PATENT DOCUMENTS

| | | |
|---|---|---|
| JP | H06-505575 A | 6/1994 |
| JP | H08-078783 A | 3/1996 |
| JP | H11-087785 A | 3/1999 |
| JP | 2000-022285 A | 1/2000 |
| JP | 2002-033546 A | 1/2002 |
| JP | 2005-538550 A | 12/2005 |
| JP | 2006-261380 A | 9/2006 |
| JP | 2006-278572 A | 12/2006 |
| JP | 2008-258298 A | 10/2008 |
| JP | 2010-225824 A | 10/2010 |
| JP | 2010-251536 A | 11/2010 |
| JP | 2012-186662 A | 9/2012 |
| WO | 93/11453 A1 | 6/1993 |
| WO | 2004/049022 A2 | 6/2004 |
| WO | 2013/046416 A1 | 4/2013 |

* cited by examiner

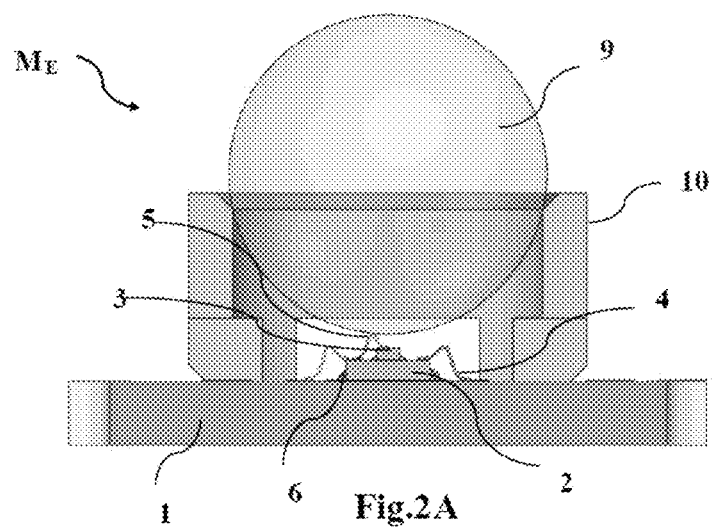
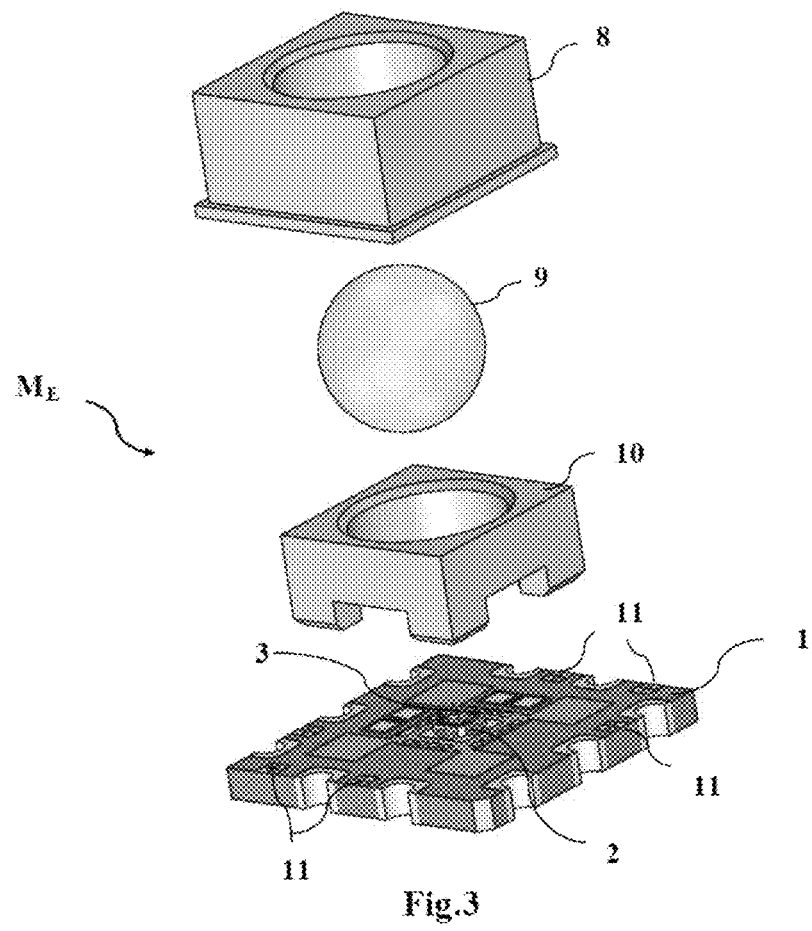

OPTOELECTRONIC MODULE FOR A CONTACTLESS FREE-SPACE OPTICAL LINK, ASSOCIATED MULTICHANNEL MODULES, ASSOCIATED INTERCONNECTION SYSTEM, METHOD OF PRODUCTION AND CONNECTION TO A BOARD

FIELD OF THE INVENTION

The present invention concerns an optoelectronic module for a contactless free-space optical link, intended generally to be brazed onto an electronic board, also known as a printed circuit under the English acronym PCB for 'Printed Circuit Board' and called an application board, and intended for converting electrical signals into optical signals or vice versa.

It concerns both a transmitter module and a receiver module and an interconnection system including at least one device with a transmitter module and at least one device with a receiver module suitable for the optical coupling with the transmitter module, intended for performing the conversion of an electrical signal into an optical signal by the transmitter module and a conversion of the optical signal transmitted by the transmitter module and received by the receiver module as an electrical signal by the latter.

The main application aimed at by the invention is the link between two electronic boards normally termed a Board-to-Board connection.

More generally, the invention may concern any link between two adjacent items of equipment, if necessary with one and/or the other displaced with respect to the other.

The invention is aimed primarily at improving the compactness of the optoelectronic modules mounted on an electronic board, in particular for reducing the footprint thereon.

The invention generally concerns optical interconnection systems intended to be implemented notably in the medical, aeronautical or transportation fields, the space field, the telecommunications field, the data communications field and the industrial field, i.e. 'Market to Market' applications.

PRIOR ART

For producing interconnection systems between two electronic application boards, or in other words 'end-use' electronic boards, several types of links are known.

First of all the electrical links between boards that exhibit a number of major drawbacks for very high throughput systems may be cited. First of all, when they exhibit a significant density of channels, electromagnetic interference is generated between channels, which is detrimental to the quality of the signals the more the signal frequency increases. Then, the electrical links as 'backplane' connections, which are useful in the field of telecommunications and data processing industries, cannot easily implement very high throughput electrical signals on dimensions compatible with the inter-board maximum distance (on the backplane) because of problems of attenuation and impedance matching.

Contact optical link systems are also known, using optoelectronic modules and an optical link created by one or more optical fibers. Each optoelectronic transmitter or receiver module normally referred to under the acronym OSA for 'Optical Subassembly' consists of an electronic board, an optoelectronic component and its electronic control component, one or more optical fibers which may be concatenated in ribbons and an optical coupling device between the optoelectronic component and the optical fiber (s). Each OSA module is then attached, preferably by brazing onto an application board, a functional optical link system thus including at least one transmitter module (TOSA for 'Transmitter Optical Subassembly') and at least one receiver module (ROSA for 'Receiver Optical Subassembly') optically coupled to the TOSA transmitter module.

Commercial products known as D-Lightsys® marketed by the applicant RADIALL may be cited which may involve either a ROSA module or a TOSA module or a system incorporating both ROSA and TOSA modules.

While these optical link systems have given and still give complete satisfaction in particular in terms of performance, notably for high throughput signals, they may still be improved notably in terms of weight, dimensions, and production costs of modules.

The requirements associated with some embedded applications, mean that the maximum dimensions that an optoelectronic module, either the transmitter or the receiver, may occupy on each application board are very small. Thus, the possible footprint on an application board of a module must be less than 100 $mm^2$ for some aeronautical applications.

However, all the known optical fiber optoelectronic modules, such as those present in the D-Lightsys® range, exhibit a much larger footprint due, either to the implementation of the necessary connections for interfacing with the optical fiber, or to the use of optical fiber directly within the TOSA or the ROSA.

In addition, the constraint of a smaller footprint, means that there are other requirements to be taken into account:
  providing an electro-optical (transmitter) and optoelectronic (receiver) conversion of digital or analog signals in a band of 0 to several tens of gigabits per second (Gbps) or gigahertz,
  routing the optical signal from one board to another in spite of an imperfect transmitter/receiver alignment (lateral and angular offset) and ensuring the continuity of the link under these conditions,
  defining a robust link, i.e. compatible with environments highly constrained environments, such as aerospace, aeronautical, medical, telecoms and defense environments, and notably being capable of operating at temperatures from −40° C. to +85° C., and withstanding shocks and vibrations according to the aeronautical standards in force,
  having a very low electrical consumption, typically less than 150 mW.

Furthermore, it may also be useful to find alternative techniques if new high throughput broadband links have to be incorporated into a system of which several elements remain fixed, like a backplane, for example.

There is therefore a particular need to improve free-space optical links without mechanical contact with optoelectronic modules, with a view to reducing the footprint thereof on the electronic boards on which they are intended to be attached.

More generally, there is a need to improve contactless free-space optical links with optoelectronic modules that meet the particular need, notably with a view to allowing a small or even very small board-to-board distance, to provide a high electro-optical and optoelectronic signal conversion rate, to enable the effective transmission of signals in spite of an imperfect alignment between transmitter module and receiver module, to be compatible with aeronautical environments, and to have a low electrical consumption.

The object of the invention is to at least partly address this/these need(s).

DISCLOSURE OF THE INVENTION

To do this, the subject matter of the invention is an optoelectronic module, intended to provide a conversion of an electrical signal from an electronic board into an optical signal propagated in free space or vice versa, including the following stack:
- an electronic board, intended to act as an interface with an electronic application board;
- an electronic control component suitable for controlling an optoelectronic component, the electronic component being attached directly onto the electronic board and electrically connected to the electronic circuit;
- an optoelectronic component suitable for transmitting or receiving a light signal via its upper surface, the optoelectronic component being attached directly on the top of the electronic control component and electrically connected to the electronic component;
- an optical device suitable for transmitting an optical signal;
- an optical device support, the support being attached, preferably by gluing or brazing, directly onto the electronic board so as to ensure the mechanical alignment between the optical device and the optoelectronic component.

It is specified that in the context of the invention, the electronic board of the optoelectronic module is a printed circuit or a stack of sheets of dielectric materials, such as alumina, in which an electrical circuit is formed.

The electronic board of the module is necessarily independent of the application or end-use electronic board on which the module according to the invention is intended to be attached. The attachment of an optoelectronic module according to the invention onto an application board may be implemented by the electrical interconnections thereof.

As a variant the electrical interconnections may be replaced on the application board by a removable connection with the aid of electrical connectors on the module and on the application board for a demountable/remountable module.

'Optoelectronic component' and 'electronic control component', here and in the context of the invention, refer to bare components, i.e. which are not encased in a package or in other words encapsulated in an electrically insulating coating, commonly known as 'packaging'.

The module according to the invention may consist of a transmitter module, the electronic control component being a control circuit for surface-emitting optoelectronic components. It may be a control circuit of a vertical-cavity surface-emitting laser diode VCSEL or a light-emitting diode LED or any other vertical photoemitter.

The optoelectronic module according to the invention may also consist of a receiver module, the electronic control component being a transimpedance amplifier, the optoelectronic component being a photodiode, notably a PIN photodiode.

The module according to the invention is advantageously arranged at a distance of between 1 and 400 mm from its complementary module.

The electronic control component may be glued or brazed or attached according to a 'flip-chip' technique directly onto the surface of the electronic board.

Likewise, the optoelectronic component may be glued, brazed or attached according to a 'flip-chip' technique directly onto the surface of the electronic control component.

The optical device may be a lens. This lens may be a refractive lens or a diffractive lens or a combination of refractive and diffractive elements. This device may also incorporate a diffusing element such as a holographic diffuser, for example. According to one advantageous variant embodiment, the module according to the invention includes a casing attached directly onto the electronic board, the casing being suitable for mechanically protecting the components and the electronic board and where necessary the lens and its support with respect to the external environment. Preferably, the casing is suitable for maintaining the lens in its support.

According to one variant instead of the lens, a window may be used transparent to at least one transmission or reception wavelength of the optoelectronic component. It may involve a flat strip arranged directly above the module stack, i.e. directly above the optoelectronic component. According to this variant, the casing may include, on its upper face, a window transparent to at least one transmission or reception wavelength of the optoelectronic component, the transparent window being hermetically sealed to the body of the casing.

Regardless of the optical device arranged above a module according to the invention, its divergence or convergence characteristics may advantageously be determined according to the distance between a transmitter module and a receiver module, so that the ratio between the light intensity emitted by the transmitter module and the intensity picked up by the receiver module varies approximately between 5 and 25 dB.

The substrate of the electronic board may include on its upper face, one or more of the following features in combination:
- at least a first group of reference marks forming positioning patterns for the optoelectronic component relative to the electronic board;
- at least a second group of reference marks forming positioning patterns for the optoelectronic component relative to the lens support;
- at least a third group of reference marks forming positioning patterns for the optoelectronic module relative to an electronic application board onto which the module is intended to be attached. This third group of patterns may also be on the lower face or on at least one of the lateral faces of the substrate of the electronic board.

The three groups of reference marks are advantageously grouped into a single one in the invention provided in order to optimize the relative alignments.

Conventional self-alignment techniques in surface mounted components (SMC) such as reflow (QFN for 'Quad Flat No-lead package') may be used for clearing this third group of reference marks.

Advantageously, each pattern consists of a grid of adjacent squares, two adjacent squares exhibiting a contrast between them.

The electronic board substrate may include an electrical connector intended to be connected with a complementary electrical connector connected to the electronic application board.

In another aspect the invention concerns a multichannel module including at least two optoelectronic modules described above with a common electronic board onto which the electronic control components are attached.

The multichannel module may include an optical device and an optical device support common to the optoelectronic modules.

One of the two optoelectronic modules may be a transmitter module and the other of the two modules a receiver module.

The optoelectronic modules of the same multichannel module may be all of the same type, transmitter or receiver. In this case, advantageously, the optoelectronic components are all produced in the same chip generally called a bar. Similarly, the electronic control components of the optoelectronic modules may be combined in a bar.

The multichannel module may include at least two transmitter modules such as laser diodes which may operate at different wavelengths. This enables the optical channels to be differentiated more easily.

The invention also concerns an optical interconnection system including:
at least one transmitter module previously described;
at least one receiver module previously described.

Advantageously, the distance between transmitter module and receiver module is between 1 and 400 mm.

In yet another one of its aspects the invention also concerns a method of production of an optoelectronic module previously described, including the following steps:
mechanical positioning of the electronic control component with respect to the electronic board then attaching the control component directly onto the board;
mechanical alignment of the optoelectronic component with respect to the electronic board by means of the first group of patterns, then attaching the aligned optoelectronic component, directly onto the attached control component;
mechanical alignment of the optical device support with respect to the optoelectronic component by means of the second group of patterns, then attaching the aligned optical device support, directly onto the board.

The invention finally concerns a method of connecting an optoelectronic module previously described onto an electronic application board, including a step of mechanical alignment of the optoelectronic module with respect to the electronic application board by means of the third group of patterns, then attaching the aligned optoelectronic module, directly onto the electronic application board, preferably by reflow welding according to a 'surface mounted component' (SMC) technique.

Thanks to the stacking of bare components on an electronic board, the footprint of an optoelectronic module according to the invention is much smaller than a module according to the prior art.

With the normal dimensions of the optoelectronic components and electronic control components, the footprint of a module according to the invention on an application board may be less than 100 mm$^2$, typically of the order of 64 mm$^2$.

One advantage subsequent to direct stacking is that the optoelectronic component, in particular a VCSEL laser may be maintained in a favorable thermal environment at low temperature by the control component below, in particular by the laser driver. The lower electronic chip acts as a heat sink.

Optoelectronic transmitter and receiver modules according to the invention may be used for producing a board-to-board optical link with a small or even very small distance, typically less than ten mm, since, the transmission and reception of optical signals via the active surface of a VCSEL laser respectively a PIN photodiode, is very effective without loss even at a high throughput.

And for this same reason, optoelectronic transmitter and receiver modules according to the invention may also be used to produce a board-to-board optical link with a large distance, typically a few tens of mm.

The groups of patterns as visual reference marks allow very accurate, straightforward mechanical alignment between components of a module according to the invention and between it and the application board on which it is attached, by means of a normal machine for positioning components, commonly known as 'pick and place'.

With a transmitter module and a receiver module according to the invention, the inventors believe that an optical link may be obtained for a wide range of applications since it is possible to vary the parameters of:
distance between transmitter module and receiver module between 1 and 400 mm,
rate of the transmitted digital signals between 0 and several tens of Gbps,
tolerances of axial misalignment from 0 to 10 mm and angular misalignment from 0 to 10°.

Typically with a footprint on a board of the order of 64 mm$^2$ being able to be reduced to 16 mm$^2$, a module according to the invention may offer a maximum throughput of digital signals of 10 Gbps or more for a board-to-board distance of 50 mm.

Thus the advantages of an optoelectronic module according to the invention compared to an optical fiber optoelectronic module according to the state of the art are numerous including:
reduction in the size of the module, and in particular in the footprint on the application board, which makes it possible to fulfill board-to-board connection applications at a small or even very small distance, typically from 1 to a few tens of mm;
reduction in weight due to removing elements notably of the optical coupling device between optoelectronic component and optical fiber(s);
optimization of the cost since the optical fibers may represent a significant cost in the price of an optoelectronic module;
ease of reconfiguring a transmitter and receiver module system according to the invention and of disconnecting an electronic board from a backplane: indeed, with a module according to the invention, one board may be replaced by another in a backplane without any difficulties associated with the presence of optical fibers, and/or to meet very precise alignment requirements;
possibility of establishing communication via optical link between two elements requiring very fast disconnection if necessary;
ease of installation on board with standard offset electronic equipment because there is no fitting of optical fibers to be handled and the alignment accuracies are compatible with the positioning accuracies of the application boards.

DETAILED DESCRIPTION

Figure 2:
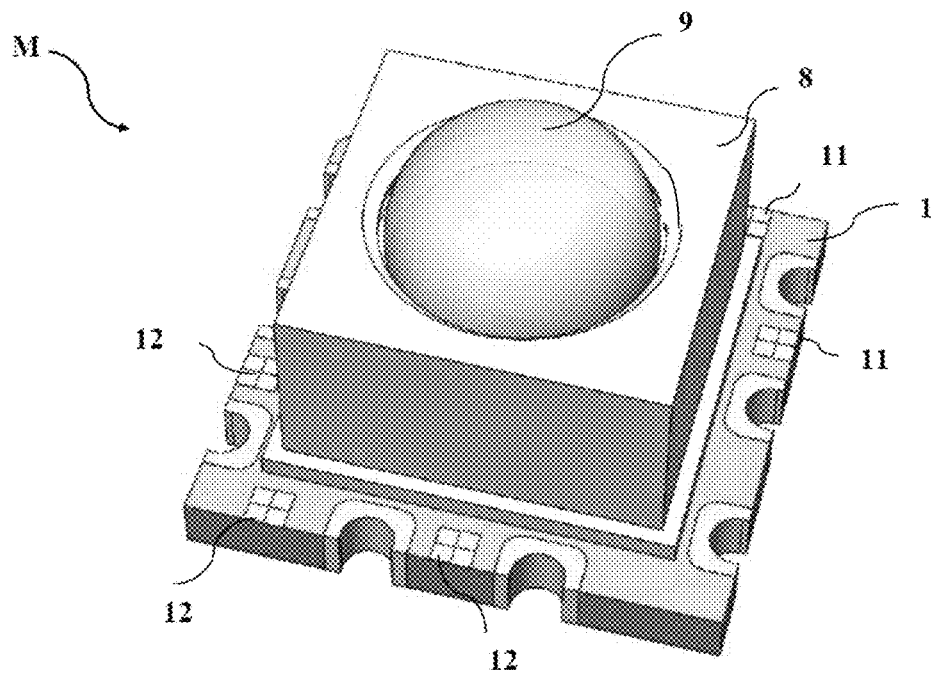
Figure 4:
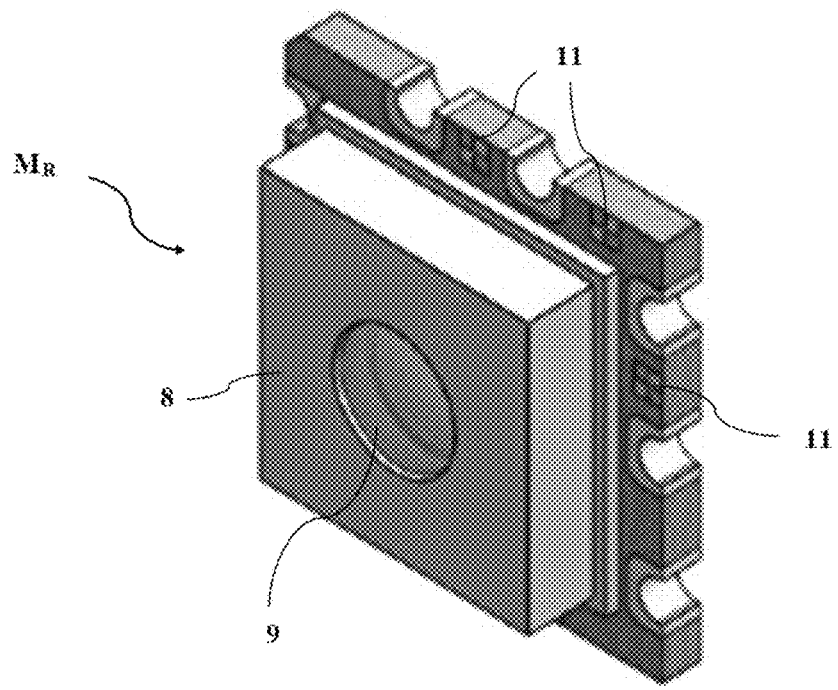
Figure 5:
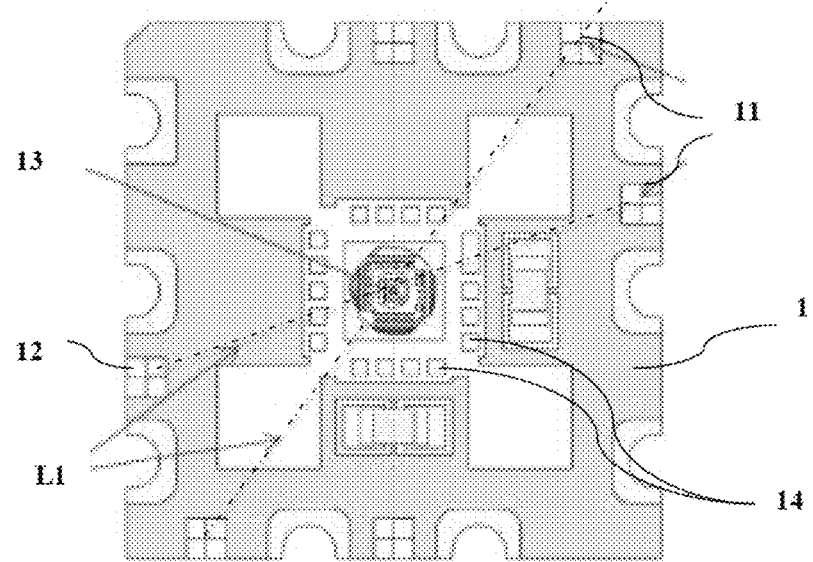
Figure 6:
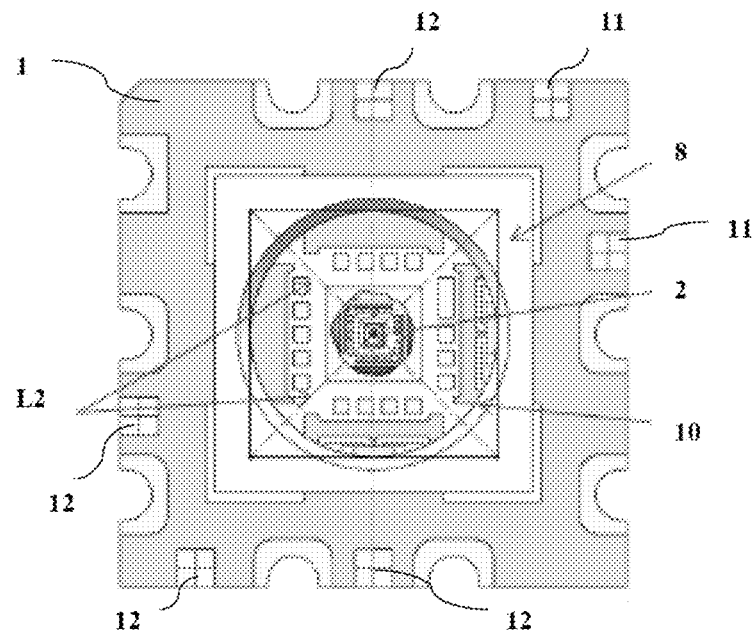
Figure 7:
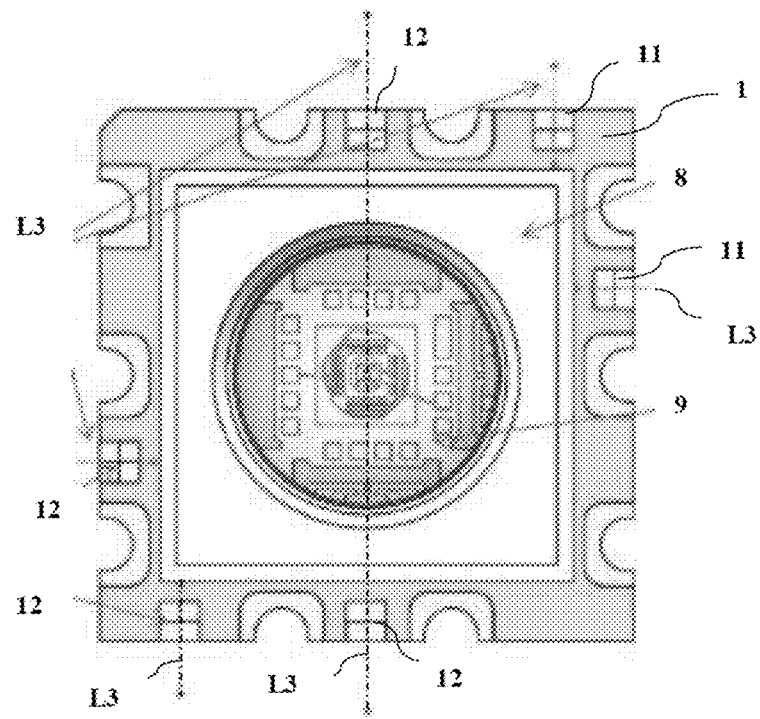

Other advantages and features of the invention will better emerge on reading the detailed description of examples of implementation of the invention given illustratively and non-restrictively with reference to the following figures in which:

FIG. 1 is a schematic side view of an embodiment of an optoelectronic module according to the invention, FIG. 2 is a perspective view of an example of optoelectronic module according to one variant of the invention, FIG. 2A is a sectional view of the module according to FIG. 2 in the transmitter version, FIG. 3 is an exploded view of the main components of the transmitter module according to FIG. 2A, FIG. 4 is a perspective view of an example of optoelectronic module in the receiver version according to one variant of the invention, FIG. 5 is a top view of an electronic board of a module according to the invention, the figure depicting a first pattern group for the mechanical alignment between the board and the optoelectronic component, FIG. 6 is a top view of an electronic board of a module according to the invention, the figure depicting a second pattern group for the mechanical alignment between the optoelectronic component and the optical lens support, FIG. 7 is a top view of an electronic board of a module according to the invention, the figure depicting a third pattern group for the mechanical alignment between the optoelectronic module and the application board onto which it is intended to be attached, FIGS. 8A to 8D schematically depict various configurations of optical interconnection systems with at least one optoelectronic transmitter module and one receiver module according to the invention, some systems consisting of multichannel modules.

Throughout the application, the terms 'vertical', 'lower', 'higher', 'bottom', 'top', 'below', 'above' are understood by reference to the direction in the stack of the various components of an optoelectronic module according to the invention.

An optoelectronic module M according to the invention is represented in FIG. 1.

The various elements of the module M are stacked on top of each other and attached therebetween, preferably by gluing by means of an epoxy glue, for example, or by brazing.

Thus, from the bottom to the top of the stack, the module M includes:
- a printed circuit 1 which will act as an interface with an electronic application board;
- an electronic control component 2 attached directly onto the printed circuit 1 and electrically connected to the electronic circuit by wires 4 welded according to a technique of 'wire-bonding' or bridging;
- an optoelectronic component 3 suitable for transmitting or receiving a light signal via its upper surface, the optoelectronic component being directly attached on the top of the electronic control component and electrically connected to the electronic component by a technique of microwiring, e.g. by means of soldered wires 5, or by a 'flip-chip' assembly technique or other electronic interconnection techniques of conventional microelectronics.

The components 2 and 3 are bare, i.e. non-encapsulated components.

Instead of a printed circuit (PCB for 'Printed Circuit Board'), there may also be an electronic board the substrate of which consists of a stack of layers or sheets of dielectric materials, such as alumina and within which a circuit of electrical conductors is arranged.

As illustrated in FIG. 1, the electronic control component 2 may be attached onto the circuit 1 and the optoelectronic component onto the control component 2 by means of an epoxy resin glue, for example, or a brazing solder 6 respectively 7. As a variant, the 'flip-chip' assembly technique may also be used. This technique makes it possible to simultaneously perform the function of mechanical attachment and electrical connection. Other conventional techniques such as collective wiring, 3D wiring, etc. may also be used.

The optoelectronic module according to the invention may be a transmitter module as shown in FIGS. 2, 2A and 3, in which case the optoelectronic component 3 is a Vertical-Cavity Surface-Emitting Laser (VCSEL) or any other surface-emitting optoelectronic component and the electronic component 2 is a laser driver unit.

The optoelectronic module according to the invention may be a receiver module as illustrated in FIG. 4, in which case the optoelectronic component 3 is a PIN photodiode and the electronic component 2 is a transimpedance amplifier for photodiode.

The stack depicted in FIG. 1 enables the optoelectronic module according to the invention to have a small footprint on an application board.

Advantageously, the module according to the invention includes a casing 8 for protecting the mechanical components 2, 3, 4, 5, 6, 7, 9 of the stack and the printed circuit 1.

According to the invention, as illustrated in FIGS. 2 to 4, the module M includes a lens 9 mounted in a support 10 directly attached, preferably by brazing or gluing to the printed circuit 1. The support 10 for the lens 9 is dimensioned and attached so as to ensure the mechanical alignment between the lens 9 and the optoelectronic component 3. Thus the optical device is not in direct contact with the active surface of the optoelectronic component and does not risk damaging it.

The lens 9 may advantageously be a spherical lens as in the receiver module $M_R$ illustrated in FIGS. 2, 2A and 3. It may also be a simple transparent optical window as in the transmitter module $M_E$ in FIG. 4.

As seen in FIG. 2 for the transmitter module $M_E$ and in FIG. 4 for the receiver module $M_R$ the casing 8 mechanically protects the device 9 already aligned in its support 10.

According to one advantageous embodiment, alignment pattern groups 11, 12, 13 are provided directly on the upper surface of the printed circuit 1 allowing straightforward mechanical alignments to be obtained between each constituent component of the stack of a module according to the invention, and of the latter with the application board on which it is intended to be attached.

Ensuring the mechanical alignments ensures the optical alignments necessary for the correct operation of the optoelectronic system incorporating at least one transmitter module $M_E$ and at least one receiver module $M_R$ that converts an optical signal transmitted by the transmitter module into a digital signal.

All the patterns 11, 12, 13 that allow the various mechanical alignments preferably consist of a grid of adjacent squares, two adjacent squares being of different contrast, in particular by local change of color of the substrate of the printed circuit 1, as illustrated in FIGS. 5 to 7.

As explained later the patterns 11, 12, 13 ensure mechanical alignments with a normal component positioning machine, generally known as a 'pick and place' machine.

Thus, first of all the patterns 11 allow a mechanical alignment between the printed circuit 1 of the module and the optoelectronic component 3 by the positioning of lines L1 in coincidence with the patterns 11, as depicted in FIG. 5.

The patterns 12 allow a mechanical alignment between the optoelectronic component 3 and the support 10 of the lens 9 by the positioning of lines L2 in coincidence with the patterns 12, as depicted in FIG. 6. The mechanical alignment makes it possible to easily achieve a positioning tolerance of the support 10 and therefore of the optical lens 9 with respect to the optoelectronic component 3 along the three axes x, y and z such that no operation of adjustment of the laser beam is necessary once the module according to the invention is attached onto its application board. The absence of dynamic alignment, i.e. with components under voltage, allows an assembly at lower cost.

Finally, the patterns 13 allow a mechanical alignment between the printed circuit 1 and the application board on which the optoelectronic module is placed before being attached, by the positioning of lines L3 in coincidence with the patterns 12, as depicted in FIG. 6. An optoelectronic module according to the invention may therefore be easily aligned by a user-customer with the application board, preferably by a surface mounted component SMC technique then attached notably by reflow welding.

As this emerges from the method illustrated in FIGS. 5 to 7, the pattern groups 11, 12, 13 may have patterns in common.

The main steps of producing an optoelectronic module M according to the invention are therefore as follows:

- mechanical positioning of the electronic control component 2 with respect to the printed circuit 1, then attaching the control component 2 directly onto the board;
- mechanical alignment of the optoelectronic component 3 with respect to the printed circuit 1 by means of the patterns 11, then attaching the aligned optoelectronic component, directly onto the attached control component 2;
- mechanical alignment of the lens support 10 with respect to the optoelectronic component by means of the patterns 12, then attaching the aligned lens support 10, directly onto the printed circuit 1.

Once the optoelectronic module M has been produced, it may advantageously be provided with a cover for mechanically covering and protecting all the components including the top of the lens 9. This cover may, for example, be snapped into place on the edges of the casing 8. Thus, during the transport and handling of the module M until it is put in place and attached onto an application board, the module's components are mechanically protected. A user-customer has only to remove this cover, by simple manual unclipping or with a tool immediately prior to placement on the application board.

A user-customer of the application board then only has to perform one step of mechanical alignment of the optoelectronic module M according to the invention with respect to the electronic application board by means of the patterns 13, then the attachment of the aligned optoelectronic module M, directly onto the electronic application board, preferably by reflow welding according to a 'surface mounted component' (SMC) technique.

Figure 8A:
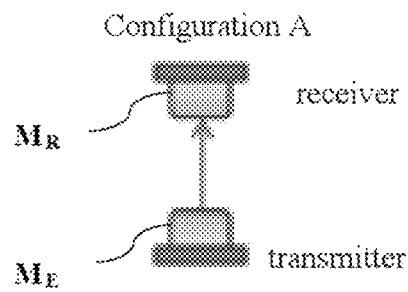

FIG. 8A describes the configuration of an optical interconnection system with a transmitter type optoelectronic module like that illustrated in FIG. 2, which is interconnected with a transmitter type optoelectronic module like that illustrated in FIG. 4.

It is conceivable to combine at least two optoelectronic modules according to the invention that have just been described in the same multichannel module. In this case, the two or more optoelectronic modules are attached onto the same printed circuit 1.

As a variant, it may be provided that within a multichannel module all the optoelectronic modules share the same optical device 9 and the same optical device support 10.

Figure 8B:
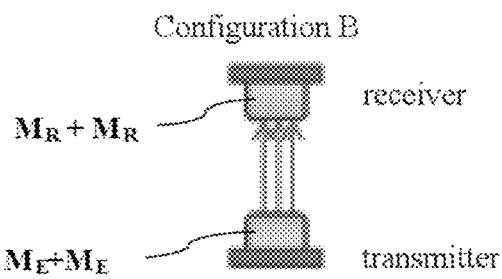

As a variant, as depicted in FIG. 8B, all the optoelectronic modules of the same multichannel module may be of the same type, transmitter or receiver, e.g. laser diodes or photodiodes. Thus as depicted in this FIG. 8B, a multichannel module including a number n of transmitter modules is interconnected with a multichannel module including the same number n of receiver modules.

As a variant, the laser diodes may operate at the same wavelength $\lambda$. In this case, advantageously, a single chip called a bar will comprise the laser diodes. According to another variant, the laser diodes may operate at different wavelengths $\lambda 1$ and $\lambda 2$, for example, as depicted in FIG. 8D.

Figure 8C:
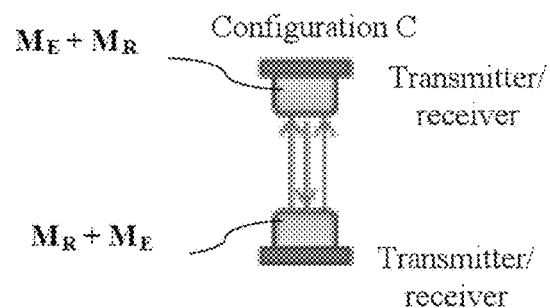
Figure 8D:
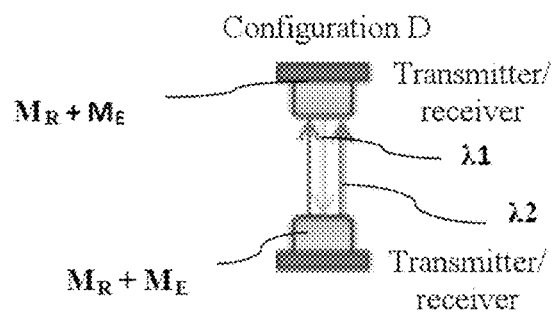

In another variant illustrated in FIG. 8C, a multichannel module may comprise both at least one laser diode and one photodiode.

Other variants and improvements may be provided without, however, departing from the scope of the invention.

The expression 'comprising one' should be understood as being synonymous with 'comprising at least one', unless otherwise specified.

The invention claimed is:

1. An optical interconnection system including:
   at least one first optoelectronic module intended to provide a conversion of an electrical signal from an electronic board into an optical signal propagated in free space or vice versa, including the following stack:
      an electronic board, intended to act as an interface with an electronic application board and comprising a substrate and an electronic circuit;
      an electronic control component suitable for controlling an optoelectronic component, the electronic control component being attached directly onto the electronic board and electrically connected to the electronic circuit;
      an optoelectronic component suitable for transmitting or receiving a light signal via its upper surface, the optoelectronic component being attached directly on the top of the electronic control component and electrically connected to the electronic control component;
      an optical device suitable for transmitting an optical signal;
      an optical device support, the support being attached directly onto the electronic board so as to ensure the mechanical alignment between the optical device and the optoelectronic component,
      the first optoelectronic module being a transmitter module, the electronic control component being a control circuit for surface-emitting optoelectronic components, and the optoelectronic component being a surface-emitting component; and
   at least one second optoelectronic module intended to provide a conversion of an electrical signal from an electronic board into an optical signal propagated in free space or vice versa, including the following stack:
      an electronic board, intended to act as an interface with an electronic application board;
      an electronic control component suitable for controlling an optoelectronic component, the electronic control component being attached directly onto the electronic board and electrically connected to the electronic circuit, the electronic control component being a transimpedance amplifier;
      an optoelectronic component suitable for transmitting or receiving a light signal via its upper surface, the optoelectronic component being attached directly on the top of the electronic control component and electrically connected to the electronic control component;
      an optical device suitable for transmitting an optical signal;

an optical device support, the support being attached, directly onto the electronic board so as to ensure the mechanical alignment between the optical device and the optoelectronic component,
the second optoelectronic module being a receiver module and the optoelectronic component being a photodiode.

2. The optical interconnection system according to claim 1, wherein the electronic control component of the first optoelectronic module is glued or brazed or attached according to a 'flip-chip' technique directly onto the surface of the electronic board of the first optoelectronic module.

3. The optical interconnection system according to claim 1, wherein the optoelectronic component of the first optoelectronic module is glued or brazed or attached according to a 'flip-chip' technique directly onto the surface of the electronic control component of the first optoelectronic module.

4. The optical interconnection system according to claim 1, wherein the optical device of the first optoelectronic module is a refractive lens or a diffractive lens or a combination of refractive and diffractive elements.

5. The optical interconnection system according to claim 1, including a casing attached directly onto the electronic board of the first optoelectronic module, the casing being suitable for mechanically protecting the optoelectronic component, the electronic component, and the electronic board of the first optoelectronic module with respect to the external environment.

6. The optical interconnection system according to claim 1, wherein the substrate of the electronic board of the first optoelectronic module includes on its upper face, at least a first group of reference marks forming positioning patterns for the optoelectronic component of the first optoelectronic module relative to the electronic board of the first optoelectronic module.

7. The optical interconnection system according to claim 1, wherein the substrate of the electronic board of the first optoelectronic module includes on its upper face, at least a second group of reference marks forming positioning patterns for the optoelectronic component of the first optoelectronic module relative to the optical device support of the first optoelectronic module.

8. The optical interconnection system according to claim 1, wherein the substrate of the electronic board of the first optoelectronic module includes on its upper face or on its lower face or on at least one of the lateral faces, at least a third group of reference marks forming positioning patterns for the first optoelectronic module relative to an electronic application board onto which the module is intended to be attached.

9. The optical interconnection system according to claim 1, wherein the substrate of the electronic board of the first optoelectronic module includes an electrical connector intended to be connected with a complementary electrical connector connected to the electronic application board.

10. The optical interconnection system according to claim 1, comprising a multichannel module including the first optoelectronic, module and at least another optoelectronic module with a common electronic board onto which the electronic control components of the first optoelectronic module and the at least another optoelectronic module are attached.

11. The optical interconnection system according to claim 10, wherein the optical device and the optical device support of the first optoelectronic module is common to the first optoelectronic module and the at least another optoelectronic module.

12. The optical interconnection system according to claim 10, wherein the at least another optoelectronic module is a receiver module.

13. The optical interconnection system according to claim 10, wherein the at least another optoelectronic module is a transmitter module.

14. The optical interconnection system according to claim 10, wherein the optoelectronic components of the first optoelectronic module and the at least another optoelectronic module are all produced in the same chip called a bar.

15. The optical interconnection system according to claim 10, wherein the electronic control components of the first optoelectronic module and the at least another optoelectronic module are all produced in the same chip in the form of a bar.

16. The optical interconnection system according to claim 10, wherein the at least another optoelectronic module is a transmitter module operating at a different wavelength than the first optoelectronic module.

17. A method of producing an optoelectronic module intended to provide a conversion of an electrical signal from an electronic board into an optical signal propagated in free space or vice versa, the optoelectronic module including the following stack:
an electronic board, intended to act as an interface with an electronic application board and comprising a substrate and an electronic circuit;
an electronic control component suitable for controlling an optoelectronic component, the electronic control component being attached directly onto the electronic board and electrically connected to the electronic circuit;
an optoelectronic component suitable for transmitting or receiving a light signal via its upper surface, the optoelectronic component being attached directly on the top of the electronic control component and electrically connected to the electronic control component;
an optical device suitable for transmitting an optical signal;
an optical device support, the support being attached directly onto the electronic board so as to ensure the mechanical alignment between the optical device and the optoelectronic component,
wherein the optoelectronic component is either a surface-emitting component or surface-receiving component, the method comprising:
mechanical positioning of the electronic control component with respect to the electronic board then attaching the electronic control component directly onto the electronic board;
mechanical alignment of the optoelectronic component with respect to the electronic board by means of a first group of patterns, then attaching the aligned optoelectronic component, directly onto the attached electronic control component;
mechanical alignment of the optical device support with respect to the optoelectronic component by means of a second group of patterns, then attaching the aligned optical device support, directly onto the electronic board.

18. A method of connecting an optoelectronic module produced according to the method of claim 17 onto an electronic application board, including a step of mechanical alignment of the first optoelectronic module with respect to the electronic application board by means of a third group of patterns, then attaching the aligned first optoelectronic module, directly onto the electronic application board.

* * * * *